(12) United States Patent
Honma

(10) Patent No.: US 8,456,977 B2
(45) Date of Patent: Jun. 4, 2013

(54) DIGITAL PLL CIRCUIT, INFORMATION READOUT DEVICE, DISC READOUT DEVICE, AND SIGNAL PROCESSING METHOD

(75) Inventor: Hiromi Honma, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/137,967

(22) Filed: Sep. 22, 2011

(65) Prior Publication Data
US 2012/0087225 A1   Apr. 12, 2012

(30) Foreign Application Priority Data

Oct. 12, 2010   (JP) ................................. 2010-229847

(51) Int. Cl.
*G11B 7/00*   (2006.01)
(52) U.S. Cl.
USPC .................................. 369/59.21; 369/112.14
(58) Field of Classification Search
USPC .......... 369/47.48, 59.19, 47.15, 47.19, 47.25, 369/47.28, 59.21, 59.16, 59.2, 124.05, 124.13, 369/124.11, 124.14
See application file for complete search history.

(56) References Cited

U.S. PATENT DOCUMENTS

| 2010/0020250 A1 | 1/2010 | Okamoto et al. |
| 2010/0110848 A1 * | 5/2010 | Honma ...................... 369/47.48 |

FOREIGN PATENT DOCUMENTS

| JP | 2010-154083 A | 7/2010 |
| WO | WO 2008/129708 A1 | 10/2008 |

* cited by examiner

*Primary Examiner* — Nabil Hindi
(74) *Attorney, Agent, or Firm* — McGinn IP Law Group, PLLC

(57) ABSTRACT

A digital PLL (phase locked loop) circuit (and method thereof), includes an AAF (anti aliasing filter) that limits a frequency bandwidth of an input RF (radio frequency) signal on the basis of a given cutoff frequency, an ADC (analog to digital converter) that samples an output signal of the AAF on the basis of a given sampling frequency, a down converter that converts a data rate of the ADC, and a digital phase tracking unit that generates a synchronous clock signal from an output signal of the down converter on the basis of a given internal frequency. The cutoff frequency and the sampling frequency are fixed, respectively, even when a frequency bandwidth of the RF signal fluctuates. The down converter reduces the data rate according to an increase in the frequency bandwidth of the RF signal.

10 Claims, 13 Drawing Sheets

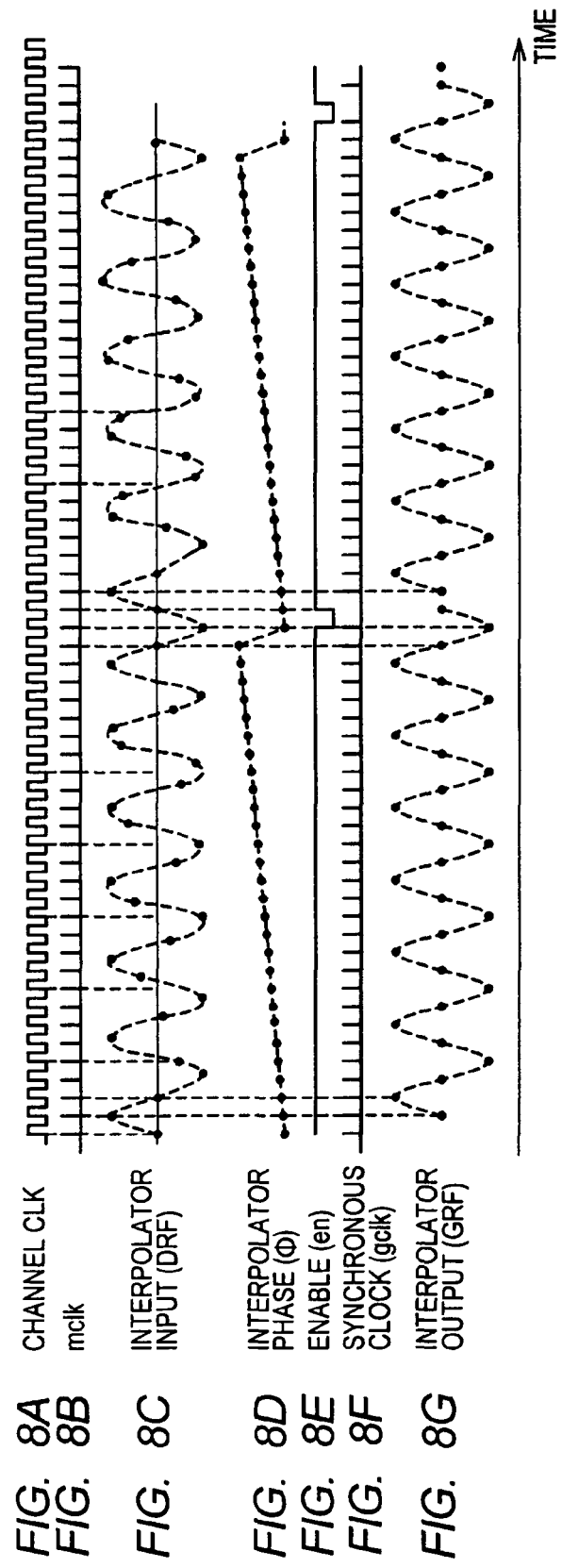

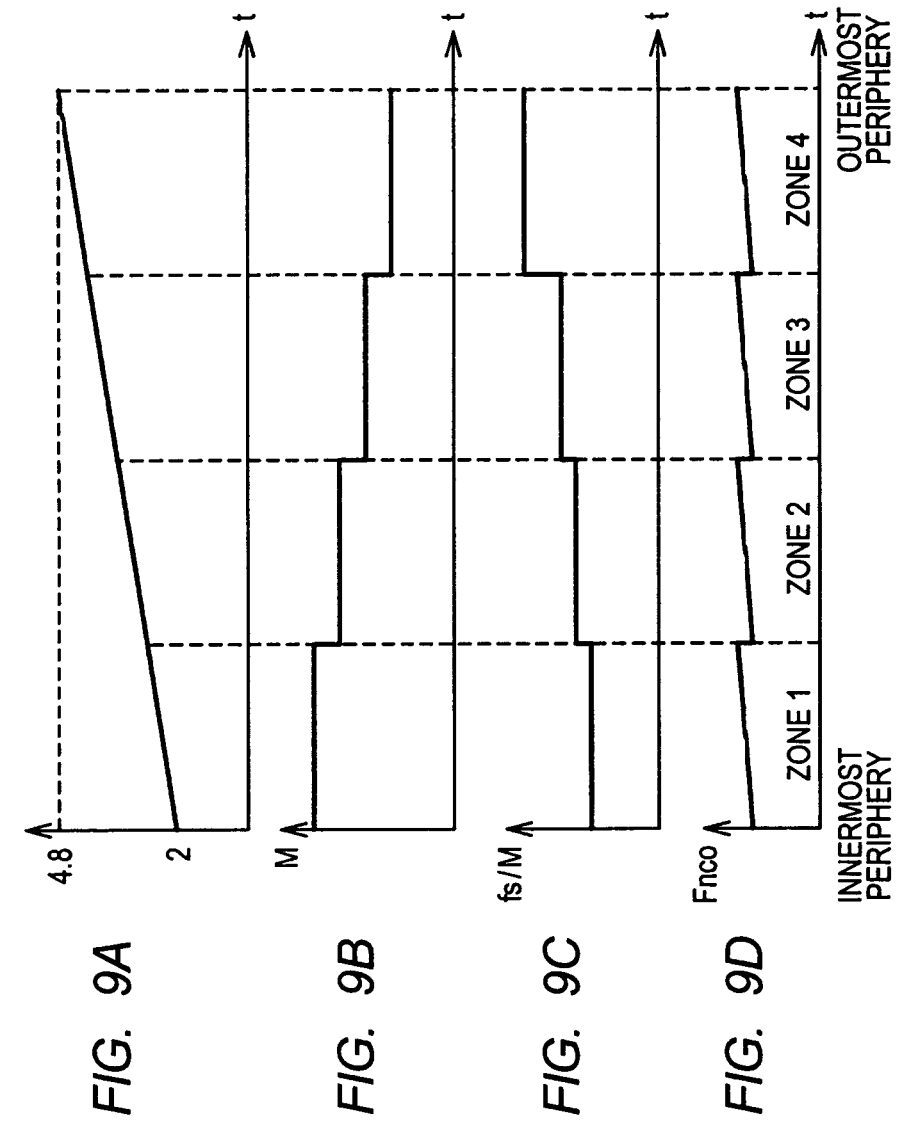

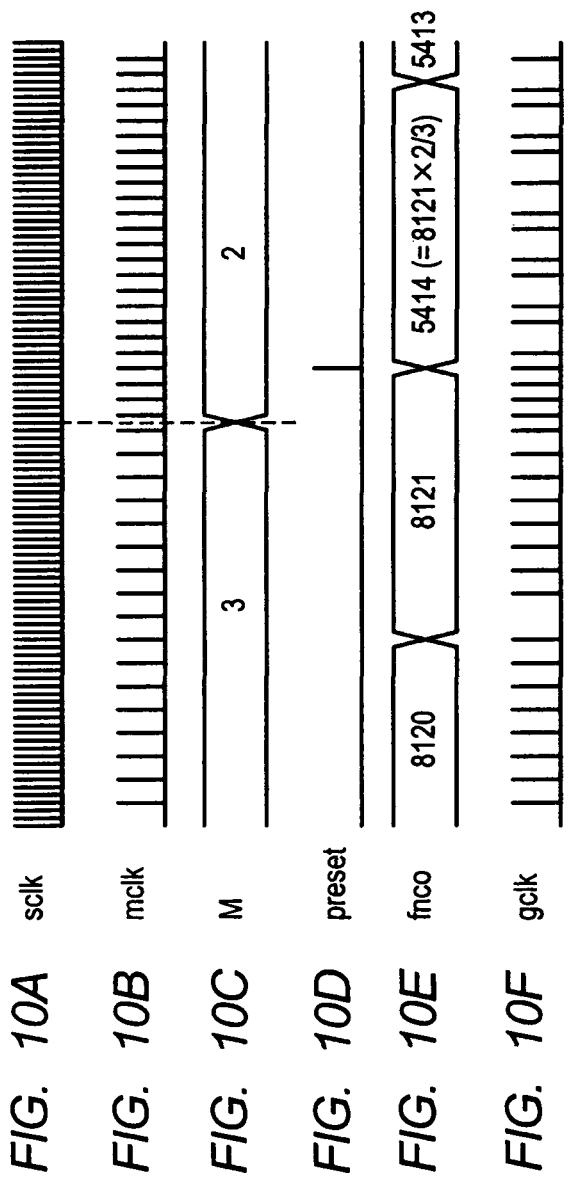

DIGITAL PLL CIRCUIT, INFORMATION READOUT DEVICE, DISC READOUT DEVICE, AND SIGNAL PROCESSING METHOD

CROSS-REFERENCE TO RELATED APPLICATIONS

The disclosure of Japanese Patent Application No. 2010-229847 filed on Oct. 12, 2010 including the specification, drawings, and abstract is incorporated herein by reference in its entirety.

BACKGROUND

The present invention relates to a digital PLL circuit that generates a synchronous clock from data recorded in, particularly, a disc recording medium, an information readout device using the digital PLL circuit, a disc readout device using the information readout device, and a signal processing method using the digital PLL circuit.

In recent years, with rapid spread of digital cameras, digital versatile disc (DVD) players, and DVD recorders, it is normal for individuals to record or reproduce large volumes of digital data including not only music data but also video data. For the purpose of saving video information, inexpensive recording media such as a DVD-R/+R have been spread, and such recording media enables reproduction by a DVD player after recording. In recent years, the DVD players have been being increasingly replaced with Blu-ray disc (BD) players that enable mass recording and reproduction.

An information reproduction technology of an optical disc device will be described. Concentric or spiral guide grooves (tracks) are formed in an optical disc medium, and countless fine information pits are formed along the tracks. The optical disc device irradiates an optical disc medium recording surface that is rotated by a spindle motor with a condensed laser beam. In this situation, focusing servo is so performed as to keep a constant distance between the optical disc surface and a beam condensing objective lens. Also, a tracking servo is performed in a radial direction of the optical disc so that the condensed beam follows the tracks. As a result, the fine information pits formed on the optical disc are accurately scanned with the condensed beam. The presence or absence of the information pits can be detected as contrasting or polarization of the condensed beam reflected light, and detected as a reproduced radio frequency (RF) signal, that is, an electric signal by a photodetector. The condensed beam diameter depends on a laser wavelength and an objective lens numeral aperture (NA), and is also finite. For that reason, an intersymbol interference occurs, and the frequency characteristics of the reproduced RF signal become a low pass filter (LET) characteristics in which a high-pass gain is deteriorated. Under the circumstances, after passing through a filter that allows the high-pass gain to be boosted, the synchronous clock is extracted by a phase locked loop (PLL), and the RF signal is identified as digital data in timing of the synchronous clock. Thereafter, after demodulation using a run length limited (RLL) code, or an error correction using an error correction code (ECC) has been conducted, the data is extracted as the music information or the video information. During recording, conversely, an ECC parity is added to user information, 8/16 modulation is conducted, and information to which a specific code has been added on a frame basis is recorded on the optical disc in synchronism with a recording clock. A meandering component is detected by the guide groove that meanders at a constant frequency in a radial direction, and the detected component is multiplied to generate the recording clock. The detected meandering component is called "wobble signal". A laser power is increased at a position to be recorded to increase a temperature of the condensed portion, and the physics are changed reversibly or irreversibly to form the fine information pits.

Incidentally, as a method for controlling the rotation of the disc recording medium such as an optical disc, there are mainly two types of systems described below. That is, there are a constant linear velocity (CLV) control system that keeps a constant linear velocity, and a constant angular velocity (CAV) control system that keeps a constant rotating angular velocity. In the CAV control, a torque of a spindle motor can be reduced, and power consumption is also suppressed. On the other hand, a ratio of the linear velocity between the inner and outer peripheries is about 2.4 times, and in a capture frequency range of the PLL by which the synchronous clock is extracted from the readout signal, when it is assumed that the frequency range of the inner periphery is 1, there is a need to cover the range of from 1 to 2.4.

Subsequently, a description will be given of a related-art PLL that extracts the synchronous clock from the reproduced RF signal. In the optical disc device, in order to enhance a read performance from the optical disc as much as possible, it is general to binalize the read RF signal by digital signal processing such as a partial response maximum likelihood (PRML) technique. To achieve this, there is a need to digitalize the RF signal by an analog to digital converter (ADC). The PLL also needs to be controlled so that a phase error of a sample string becomes minimized after digitalization. The sampling clock of the ADC is set as a frequency output of a frequency controllable local oscillator, and in order to accurately conduct phase comparison after ADC, processing is conducted by a high pass filter (HPF), and a phase error is generated from an output of the HPF by a phase comparator. The phase error is input to a digital loop filter to generate frequency information. The frequency information is converted into an analog signal by a digital to analog converter (DAC) to control an oscillation frequency of the local oscillator such as a voltage controlled oscillator (VCO). That is, a PLL loop where digital and analog signals are mixed together is formed. In the PLL, a loop delay between the ADC and the local oscillator output, such as conversion times of the ADC and the DAC, a response speed of the VCO, and an output delay due to the HPF is large, resulting in such a problem that the stability of the system is deteriorated when the loop gain is increased.

On the contrary, in order to minimize the loop delay of the PLL, there is a clock timing recovery system using digital information oversampled at a fixed frequency higher than the channel clock. For example, Japanese Patent Application Publication No. 2010-154083 discloses a related-art digital PLL. The digital PLL disclosed in Japanese Patent Application Publication No. 2010-154083 will be described with reference to FIG. 1. FIG. 1 is a block diagram illustrating a configuration of a related-art digital PLL circuit. After a signal output from an ADC 101 is processed by a filter 115 such as an HPF, the signal is subjected to rate conversion by an interpolator 102 to generate a phase error at the time of output from the interpolator 102 by a phase comparator (PC) 103. On the basis of the phase error, a loop filter (LPF) 104 generates frequency information, and controls the oscillating frequency of a numerical controlled oscillator (NCO) 106. The NCO 106 generates an interpolation phase Φ corresponding to the oscillating frequency, and controls the interpolator 102 to form a phase locked loop.

In the digital PLL of FIG. 1, because there is no conversion times of the ADC and the DAC and no input/output response time of the VCO, the loop delay can be reduced. Naturally, because the filter 115 is disposed outside the loop, there is no influence of the filter 115. Also, two sampling clock frequencies can be selected for an input channel rate so that a master clock frequency is not uselessly increased when the input signal is at a low channel rate (in particular, an inner periphery condition at the time of reproducing a CAV). There is provided a function for switching an input frequency value of the NCO 106 in a stepwise manner by a selector 111 and a multiplier 105 so that no frequency deviation of the synchronous clock occurs at the time of switching the master clock. The phase deviation at the time of switching the master clock is corrected by a first in first out (FIFO) memory 116 and a selector 117.

Likewise, as a configuration in which the PLL loop delay is minimized, and the sampling clock frequency is not increased even at the time of the low rate input, WO2008/129708 discloses a clock recovery system of the related art. The clock recovery system disclosed in WO2008/129708 will be described with reference to FIG. 2. FIG. 2 is a block diagram illustrating a configuration of a readout signal processing device including the digital PLL in the related art. The readout signal is oversampled by an ADC 202. A frequency ratio calculation unit 203 receives an output of the ADC 202, and calculates a frequency ratio of a readout signal channel clock and an output of a clock generator 201. On the basis of this result, a digital value generator 207 generates frequency information, and a DAC 211 controls a VCO 212, and an output of the VCO 212 becomes a sampling clock. That is, the sampling frequency is asynchronous with the channel clock, but the frequency ratio of the sampling clock and the channel clock is controlled to be constant. On the other hand, the output of the ADC 202 is also input to a phase correction amount calculation unit 204, and the phase correction amount calculation unit 204 generates a phase difference. A pseudo synchronous clock generator 205 receives the phase error, and generates a pseudo synchronous clock together with the phase information. This configuration is advantageous in that the PLL loop is configured by two stages to shorten the PLL loop delay while the ADC sampling clock frequency can be controlled with the degree of freedom higher than that of Japanese Patent Application Publication No. 2010-154083.

SUMMARY

However, the digital PLL disclosed in Japanese Patent Application Publication No. 2010-154083 suffers from several problems. A first problem resides in that the scale of a high bandwidth boost filter circuit including the AAF upstream of the ADC not illustrated in FIG. 1 becomes large. A general optical disc device complies with various media such as a compact disc (CD), a DVD, and a BD, and the frequency range of the channel rate to be input is very wide such that a read speed (hereinafter referred to as "multiplied speed") ranges from a normal speed to 16-times speed, and a wide range is also required for the sampling frequency in proportion to the multiplied speed. In Japanese Patent Application Publication No. 2010-154083, although the sampling frequency can be switched to two stages, the range is short. Therefore, an oscillator 113 needs to be configured by a frequency synthesizer, and to generate an appropriate sampling clock according to the multiplied speed. It is needless to say that, as a precondition for conducting A/D conversion, there is a need to limit the band upstream of the ADC for the purpose of removing aliasing noise. However, that the sampling frequency range is wide means that there is a need that a cutoff frequency range of an anti-aliasing filter (AAF) can be switched with a wide range. Further, when the filter has a boost characteristic, there is a risk that an analog circuit scale increases, a die size for large scale integration (LSI) increases, or yield is deteriorated. A second problem resides in that circuit power consumption during the CAV operation is large. This results from a fact that there are only about two kinds of switching sampling clock frequencies. A third problem resides in that when the sampling frequency is switched by an FIFO memory for the purpose of phasing when switching the sampling frequency, errors occur as much as data stored in the FIFO memory. According to the circumstances, a phase slip of the PLL occurs, and errors may occur during an overall period of one synchronous frame.

On the other hand, the optical disc device disclosed in WO2008/129708 suffers from some problems. A first problem resides in that the scale of a high bandwidth boost filter circuit including the AAF upstream of the ADC becomes large as in Japanese Patent Application Publication No. 2010-154083. The reason is described above. A second problem resides in that in order to require analog circuits (VCO and DAC), the number of circuits and the power consumption increase. This results from a fact that the ADC is configured by continuously changing the sampling clock frequency of the ADC.

Accordingly, the present invention has been made to solve the above problems, and aims at providing a stable PLL that does not degrade reproduction performance, is small in the circuit scale and the power consumption in total, and small in the loop delay for the purpose of complying with plural multiplied speeds.

Hereinafter, solution to the problem will be described with reference to reference numerals used in "Detailed Description". Those reference numerals are added for clarifying a correspondence relationship between the definitions of "What is Claimed is" and "Detailed Description". However, those reference numerals must not be used for interpretation of the technical scope of the present invention defined in "What is Claimed is".

According to an aspect of the present invention, a digital PLL circuit includes an AAF (1), an ADC (2), a down converter (3), and a digital phase tracking unit (5). In this case, the AAF (1) limits a frequency bandwidth of an input RF signal on the basis of a given cutoff frequency (fc). The ADC (2) samples an output signal of the AAF (1) on the basis of a given sampling frequency (fs). The down converter (3) converts a data rate of the output signal from the ADC (2). The digital phase tracking unit (5) generates a synchronous clock signal (gclk) from an output signal from the down converter (3) on the basis of a given internal frequency. The cutoff frequency (fc) and the sampling frequency (fs) are fixed, respectively, even if the frequency bandwidth of the RF signal fluctuates. The down converter (3) reduces the data rate according to an increase in the frequency bandwidth of the RF signal.

According to another aspect of the present invention, there is provided a signal processing method including the steps of: limiting a frequency bandwidth of an input RF signal on the basis of a given cutoff frequency (fc); sampling a signal limiting the frequency bandwidth on the basis of a given sampling frequency (fs); converting a data rate of the sampled signal; and generating a synchronous clock signal (gclk) from the signal having the converted data rate on the basis of a given internal frequency. In this case, the cutoff frequency (fc) and the sampling frequency (fs) are fixed, respectively, even if the frequency bandwidth of the RF signal fluctuates.

The step of converting the data rate includes a step of reducing the data rate according to an increase in the frequency bandwidth of the RF signal.

A first advantage of the digital PLL circuit and the signal processing method according to the present invention resides in that the scale of the analog circuit in the periphery of the ADC can be minimized. The reasons are that the ADC can be configured by an AAF having a single characteristic because the sampling frequency of the ADC can be set to a fixed frequency not depending on an input channel frequency, no frequency synthesizer is required, and none of the VCO and the DAC is required because of an interpolation digital phase locked configuration.

A second advantage of the digital PLL circuit and the signal processing method according to the present invention resides in that the power consumption of a PLL unit becomes lower toward the lower multiplied speed while the loop display of the PLL is decreased. The reason is because a decimation ratio M is changed according to the multiplied speed after high-speed sampling, and an input rate to a sample interpolation digital PLL is changed.

A third advantage of the digital PLL circuit and the signal processing method according to the present invention resides in that phase synchronization can be maintained even if the decimation ratio M is switched in a PLL locked state. The reason is because a switching timing of the frequency of the digital PLL is delayed by a timing control unit.

BRIEF DESCRIPTION OF THE DRAWINGS

FIGS. 8A to 8G are timing charts illustrating the operation a digital phase tracking unit in the digital PLL circuit according to the first embodiment of the present invention;

FIGS. 9A to 9D are timing charts illustrating a change in various numerical values with time in the digital PLL circuit according to the first embodiment of the present invention;

FIGS. 10A to 10F are timing charts illustrating a change in various numerical values with time in the digital PLL circuit according to the first embodiment of the present invention;

DETAILED DESCRIPTION

A PLL circuit and a signal processing method according to embodiments of the present invention will be described with reference to the accompanying drawings.

First Embodiment

Subsequently, an embodiment of the present invention will be described in detail with reference to the accompanying drawings.

Figure 1:
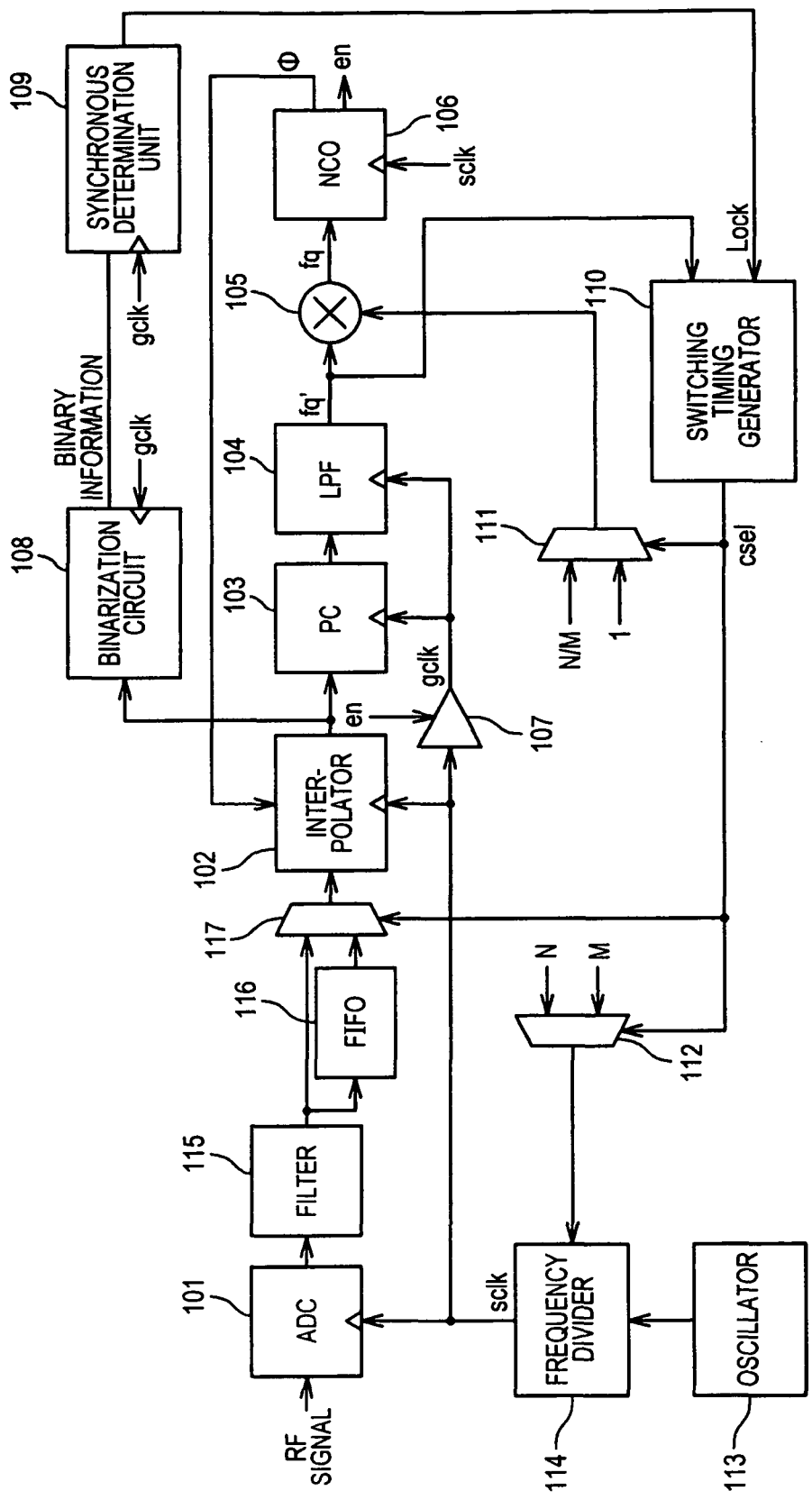
FIG. 1 is a block diagram illustrating a configuration of a digital PLL circuit in a related art.
Figure 2:
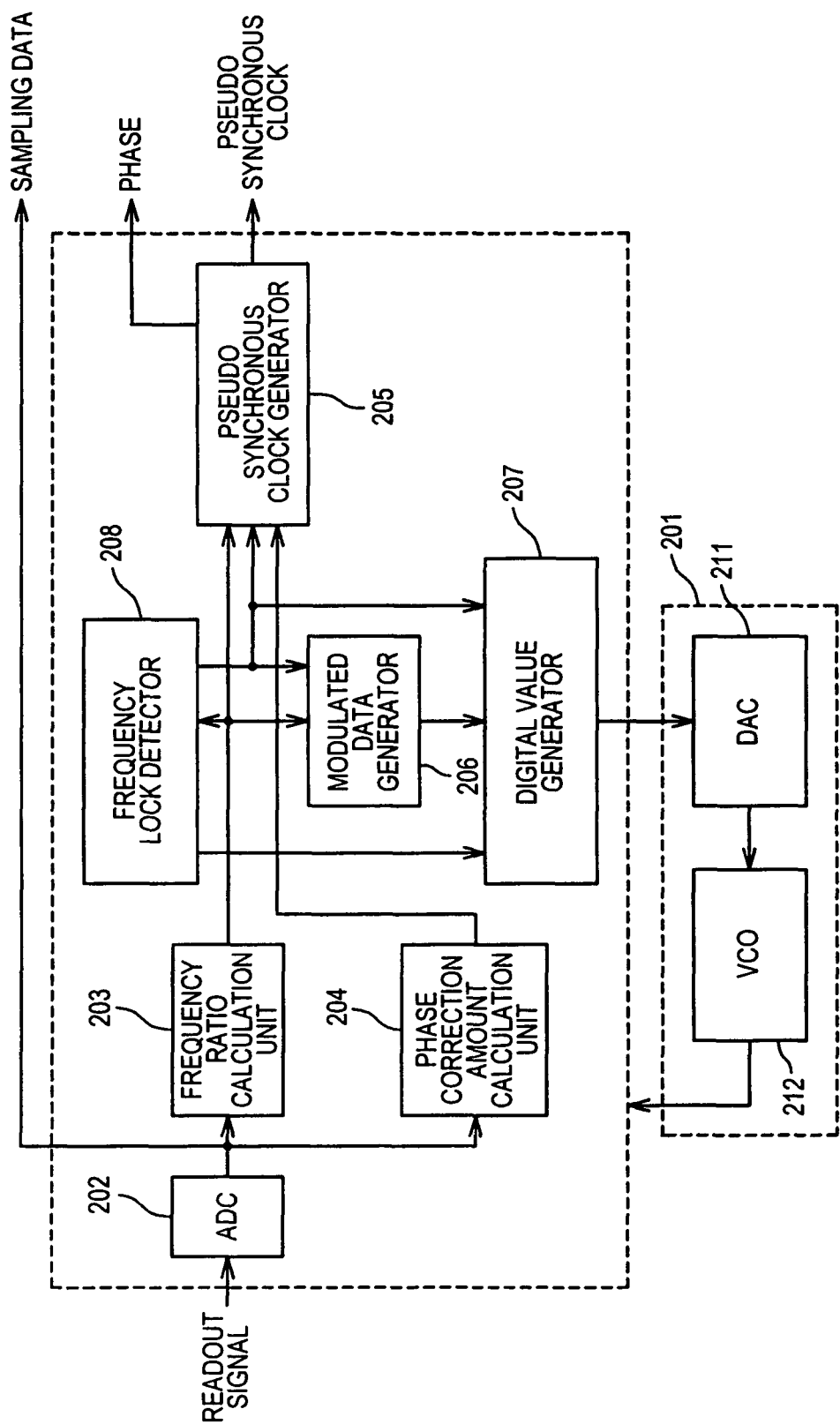
FIG. 2 is a block diagram illustrating a configuration of a readout signal processing device including the digital PLL circuit in the related art.
Figure 3:
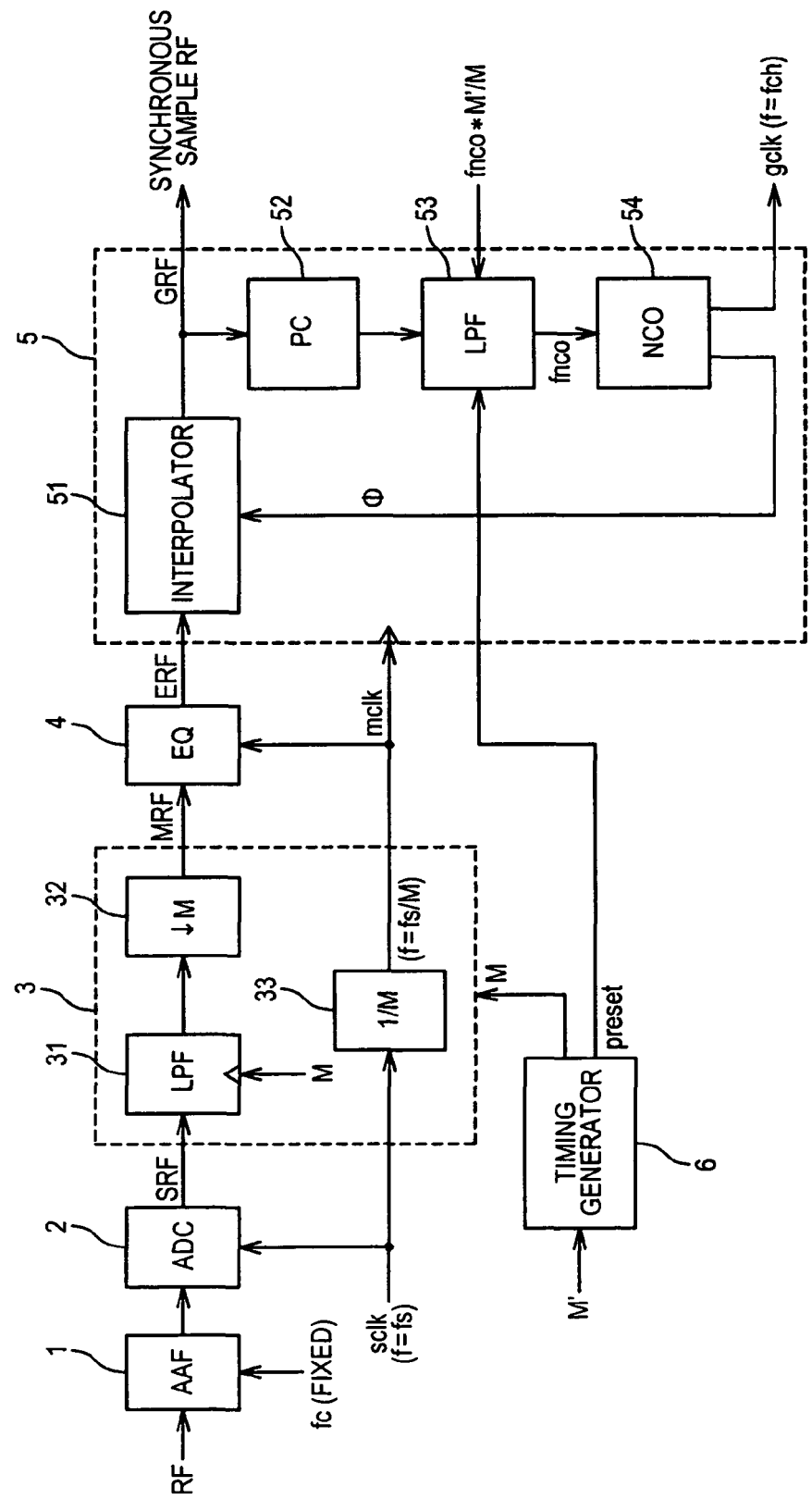
FIG. 3 is a block diagram illustrating an overall configuration of a first digital PLL circuit according to a first embodiment of the present invention.

FIG. 3 is a block diagram illustrating an overall configuration of a first digital PLL circuit according to a first embodiment of the present invention. The digital PLL circuit of FIG. 3 includes an AAF 1, an ADC 2, a down converter 3, a digital equalizer 4, a digital phase tracking unit 5, and a timing generator 6. The down converter 3 includes an LPF 31 as a decimation filter, a decimeter 32, and a clock divider 33 therein. The digital phase tracking unit 5 includes an interpolator 51, a phase comparator (PC) 52, a loop filter 53, and an NCO 54 therein.

A coupling relationship of components, and input and output signals of the respective components in the digital PLL circuit of FIG. 3 will be schematically described. In the AAF 1, an input part receives an RF signal. A cutoff frequency fc is used as a characteristic parameter of the AAF 1. In the ADC 2, a first input part is coupled to an output part of the AAF 1, and a second input part receive receives a sampling clock signal sclk having a frequency of fs, and an output part outputs an SRF signal that is a digitalized RF signal. In this example, the frequency fs is a so-called "sampling frequency". In the LPF 31, a first input part is coupled to an output part of the ADC 2, and receives the SRF signal, and a second input part receives a signal representative of the decimation radio M. In the clock divider 33, an input part receives the sampling clock signal sclk, and an output part outputs a clock signal mclk having a frequency of fs/M. In the decimeter 32, an input part receives the output signal of the LPF 31, and an output part outputs an MRF signal having the data rate of 1/M times. In the digital equalizer 4, a first input part is coupled to an output part of the decimeter 32 and receives the MRF signal, a second input part is coupled to an output part of the clock divider 33 and receives the clock signal mclk, and an output part outputs an ERF signal. In the interpolator 51, a first input part is coupled to an output part of the digital equalizer 4 and receives the ERF signal, a second input part is coupled to a first output part of the NCO 54 and receives a Φ signal, and an output part outputs a GRF signal. In the phase comparator 52, an input part is coupled to an output part of the interpolator 51 and receives the GRF signal, and an output part outputs a phase error signal. In the loop filter 53, a first input part is coupled to an output part of the phase comparator 52 and receives the phase error signal, a second input part is coupled to a second output part of the timing generator 6 and receives a preset signal, a third input part receives frequency information fnco×M'/M, and an output part outputs frequency information fnco. In the NCO 54, an input part is coupled to an output part of the loop filter 53 and receives the frequency information fnco, a first output part outputs the Φ signal, and a second output part outputs a gclk signal having a frequency of fch. In the timing generator 6, an input part receives M', a first output part outputs the decimation ratio M, and a second output part outputs a preset signal.

The operation of the digital PLL circuit in FIG. 3 will be described in detail. An RF signal read from an optical disc is first converted into a signal having a frequency bandwidth limited by the AAF 1. In this situation, the cutoff frequency fc used in the AAF 1 is set to half or lower of the sampling frequency fs so that an influence of alias can be ignored in the ADC 2 coupled to a subsequent stage. Also, the cutoff frequency fc is set to a bandwidth for allowing a signal of the highest multiplied speed necessary for reproduction pass to pass. Likewise, the sampling clock sclk has an optimum sampling frequency at the highest multiplied speed not depending on the input channel multiplied speed. With this configuration, there is no need to change the frequency of the AAF 1, and the circuit can be downsized. The ADC 2 operates at a high speed even with the lower multiplied speed input. However, when a normal ADC of the flash type is used, an analog circuit for driving a large number of comparators occupies a main part of power consumption. Therefore, there is no large difference in the total power consumption between the lower speed sampling and the higher speed sampling.

The SRF signal that is a digitalized RF signal is input to the down converter 3 and converted into a desired data rate. In this example, the down converter 3 conducts processing that is called "decimation". When the data rate is decreased by simple decimation, it is affected by alias. In order to avoid this decrease, in the down converter 3 according to the embodiment of the present invention, after the bandwidth is limited by the decimation filter 31, decimation processing is conducted by the decimeter 32. It is assumed that the frequency characteristic of the decimation filter 31 has the LPF characteristic like the above AAF. When it is assumed that the sampling frequency in the ADC 2 is fs, and the decimation ratio is M, the data rate of the MRF signal is fs/M. The decimation filter 31 can be configured by a normal finite impulse response (FIR), but can be remarkably simplified by a configuration that will be described later. There is a need to change the decimation ratio M according to the multiplied speed of the input signal, but there is a need to increase the decimation ratio M more toward the lower multiplied speed input.

The digital equalizer 4 has a high-pass boost characteristic, and receives the MRF signal output by the down converter 3 to generate an ERF signal. Thereafter, the ERF signal is supplied to the digital phase tracking unit 5. When a signal to noise ratio (SNR) of the input signal is high, the digital equalizer 4 is not essential.

The interpolator 51 within the digital phase tracking unit 5 receives the MRF signal or the ERF signal, and generates a' data GRF signal having a phase shifted from the input signal by the compensation phase $\Phi$. With the above configuration, the phase comparator 52 generates the phase error, and an output thereof is supplied to the loop filter 53. The loop filter 53 is configured by using an integral term and a proportional or the integral term and a primary LPF term, and outputs a frequency value fnco represented by a multi-bit width toward the NCO 54. The NCO 54 integrates the frequency value fnco to generate the phase information $\Phi$.

When the decimation ratio is switched from M to M', the frequency of the clock signal mclk for allowing the digital phase tracking unit 5 to operate is M/M' times. For that reason, even if the PLL is locked immediately before the decimation ratio is switched, the locked state is released as soon as the decimation ratio is switched. In order to prevent this, the input frequency fnco of the NCO 54 is multiplied by M'/M simultaneously when the decimation ratio is switched. More specifically, the loop filter 53 is so configured as to preset the integral term, and a value obtained by multiplying the frequency value fnco immediately before the decimation ratio is switched by the ratio M'/M is set in a preset timing generated by the timing generator 6. The preset timing signal is appropriately delayed with respect to timing when a value of the decimation ratio M is switched by the down converter 3, taking the internal delays of the digital equalizer 4, the interpolator 51, and the phase comparator 52 into account. With this configuration, the continuity of the phase can be kept before and after the decimation ratio is switched. When the channel frequency is continuously changed such that CAV continuous reproduction is conducted, there is a need to switch the value of the decimation ratio M during data reproduction. On the other hand, in a system using only the CLV control, or in a system that does not conduct data reproduction immediately after the value of the decimation ratio M is switched, the configuration and the function for presetting the frequency value fnco including the timing generator 6 are not required. Also, when the phase is not locked, since data cannot be reproduced, there is no need to change the frequency value fnco with switching of the value of the decimation ratio M. With the provision of a PLL locked state discriminator, a function of selecting whether the frequency value fnco is switched, or not may be added.

Subsequently, a description will be given with reference to FIG. 4 in detail of the decimation filter 31, the decimeter 32, and the clock divider 33, which configure the down converter 3.

Figure 4:
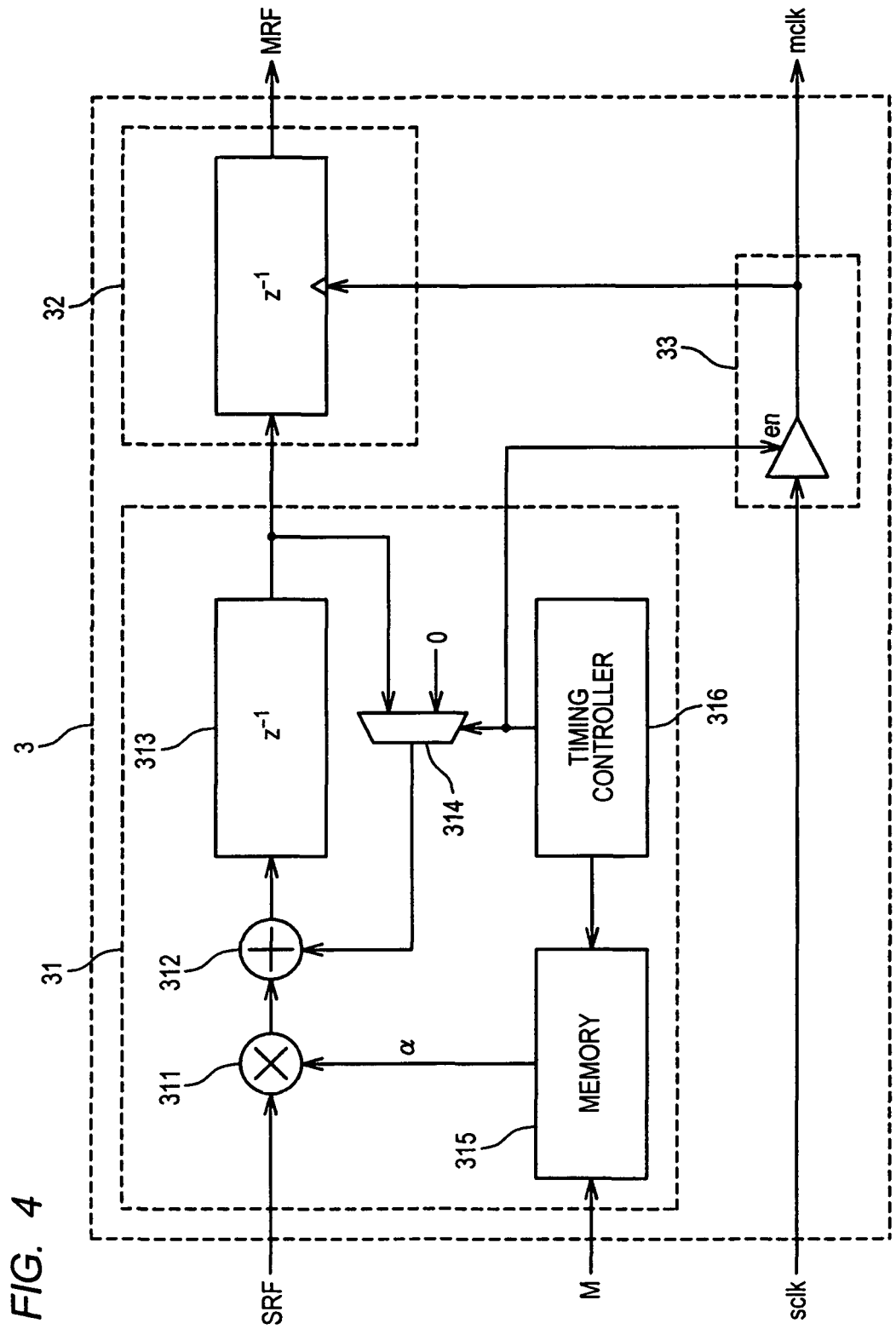
FIG. 4 is a block diagram illustrating a configuration of a down converter in the first digital PLL circuit according to the first embodiment of the present invention.

FIG. 4 is a block diagram illustrating a configuration of the down converter 3 in the first digital PLL circuit according to the first embodiment of the present invention. The down converter 3 of FIG. 4 includes the decimation filter 31, the decimator 32, and the clock divider 33. The decimation filter 31 includes a multiplier 311, an adder 312, a register 313, a selector 314, a memory 315, and a timing controller 316.

The coupling relationship of the components, and input and output signals of the respective components in the down converter 3 of FIG. 4 will be schematically described. In the decimation filter 31, a first input part receives an SRF signal, a second input part receives a tap coefficient $\alpha$, and an output part is coupled to a first input part in the adder 312. In the adder 312, a first input part is coupled to an output part of the decimation filter 31, a second input part is coupled to an output part of the selector 314, and an output part is coupled to an input part of the register 313. In the register 313, an input part is coupled to an output part of the adder 312, and an output part is coupled to a first input part of the selector 314 and a first input part of the decimeter 32. In the selector 314, a first input part is coupled to an output part of the register 313, a second input part receives a value 0, a timing signal input part receives a timing signal from the output part of the timing controller 316, and the output part is coupled to the second input part of the adder 312. In the timing controller 316, a first output part outputs the timing signal toward the timing signal input part of the selector 314 and a timing signal input part of the clock divider 33. In the memory 315, a first input part receives the decimation ratio M, a second input part is coupled to a second input part of the timing controller 316, and an output part outputs a tap coefficient $\alpha$ to the second input part of the multiplier 311. In the decimeter 32, a first input part is coupled to the output part of the register 313, a second input part is coupled to an output part of the clock divider 33, and an output part outputs an MRF signal to the external. In the clock divider 33, an input part receives a sclk signal, the timing signal input part receives the timing signal from the output part of the timing controller 316, and the output part outputs an mclk signal to the second input part of the decimeter 32 and the external.

A description will be given in detail of the operation of the respective components of the down converter 3 in FIG. 4, that is, a signal processing method using the digital PLL circuit according to the embodiment of the present invention. The decimation filter 31 can be configured by using a general FIR filter. In this case, there is a need to provide multiplexers of the same number as the order. However, in the present invention, since an output rate is slower than an input rate, a configuration that sequentially conducts multiplication can be applied. The down converter 3 in FIG. 4 multiplexes the SRF signal and the tap coefficient α by the multiplier 311, and the multiplied result is added to a value of the register 313 by the adder 312. The added result is stored in the register 313. That is, in the down converter 3 of FIG. 4, product-sum operation is conducted in time series. The tap coefficient α is stored in the memory 315 in advance, and an address is incremented in a cycle of the sampling clock sclk by the timing controller 316. After this cycle is repeated by M times, the product-sum operation result is stored in a register within the decimeter 32. At the same time, the register 313 is initialized, or the multiplied result b the multiplier 311 is stored in the register 313 as it is. An en signal is output in every M cycle, and the sampling clock sclk is gated according to the en signal to generate the clock signal mclk in which the sampling clock sclk is divided by M.

Subsequently, a configuration example of the digital PLL circuit that enhances the degree of freedom of the data rate conversion will be described with reference to FIG. 5.

Figure 5:
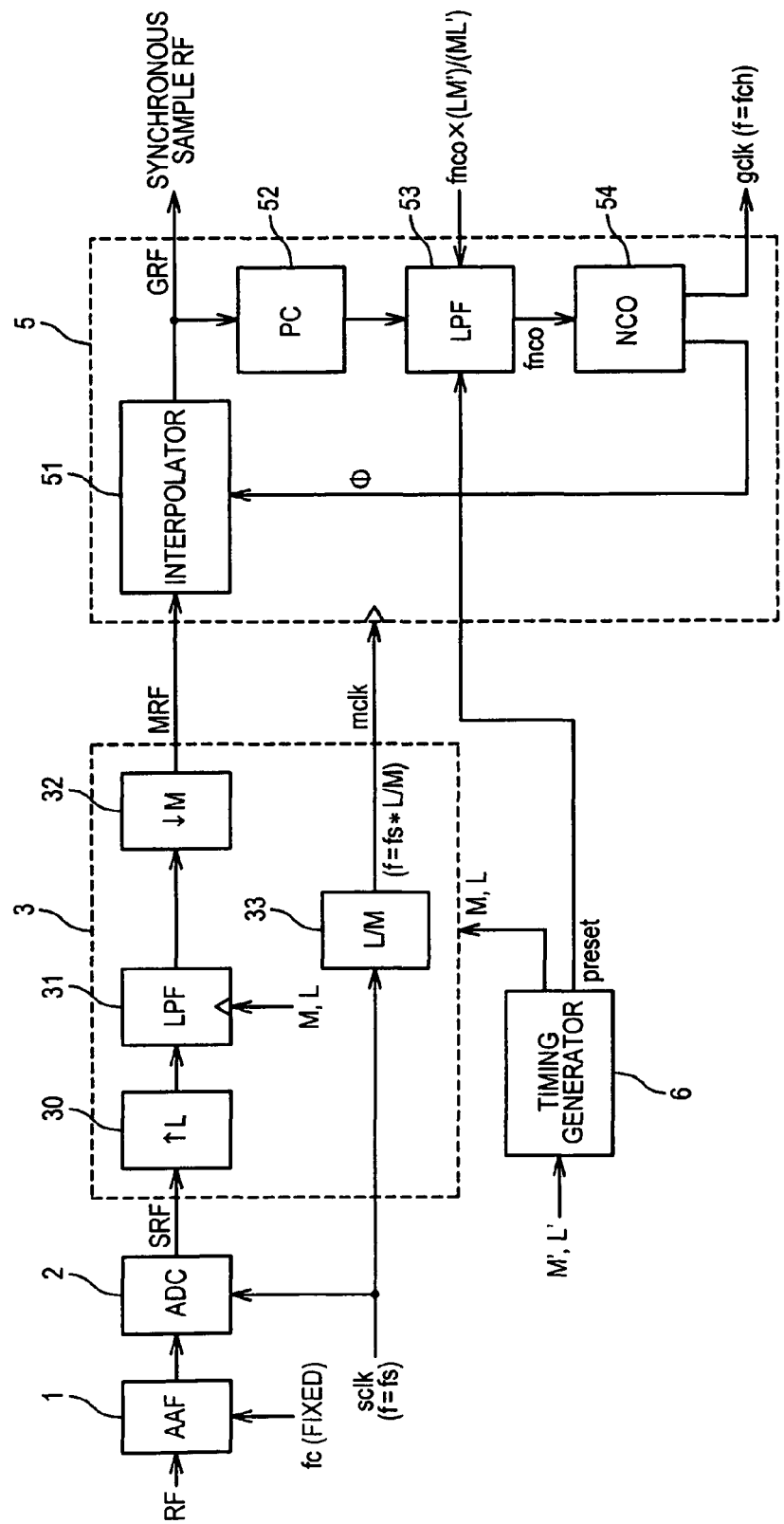
FIG. 5 is a block diagram illustrating an overall configuration of a second digital PLL circuit according to the first embodiment of the present invention.

FIG. 5 is a block diagram illustrating an overall configuration of a second digital PLL circuit according to the first embodiment of the present invention. The digital PLL circuit of FIG. 5 is obtained by modifying the digital PLL circuit of FIG. 3 as follows. In a first modification, an interpolator 30 is added between the output part of the ADC 2 and the first input part of the decimation filter 31. In this example, naturally, the output part of the ADC 2 is coupled to an input part of the interpolator 30, and an output part of the interpolator 30 is coupled to the first input part of the decimation filter 31. In FIG. 5, the digital equalizer 4 is illustrated, but may be inserted as in FIG. 3. The first input part of the interpolator 51 is coupled to the output part of the decimeter 32, and receives the MRF signal output by the decimeter 32. In a second modification, the input part of the timing generator 6 receives an interpolation ratio L' in addition to the decimation ratio M', and likewise the output part outputs an interpolation ratio L in addition to the decimation ratio M. In a third modification, the clock divider 33 outputs a signal having a frequency f=fs× L/M according to the frequency fs of the input sampling clock sclk. Other configurations of the digital PLL circuit in FIG. 5 are identical with those in FIG. 3, and therefore a more detailed description thereof will be omitted.

In the down converter 3 of FIG. 5, the interpolator 30 that is added to raise the data rate by L times is added downstream of the decimeter 32. With this configuration, the data rate of the MRF signal becomes fs×L/M, and the frequency of mclk can be designated with finer precision. In particular, this is effective in CAV reproduction including the highest multiplied speed. When the decimation ratio and the interpolation ratio are switched from M and L to M' and L', respectively, there is a need to switch the frequency value fnco by (LM'/ ML') times.

Figure 6:
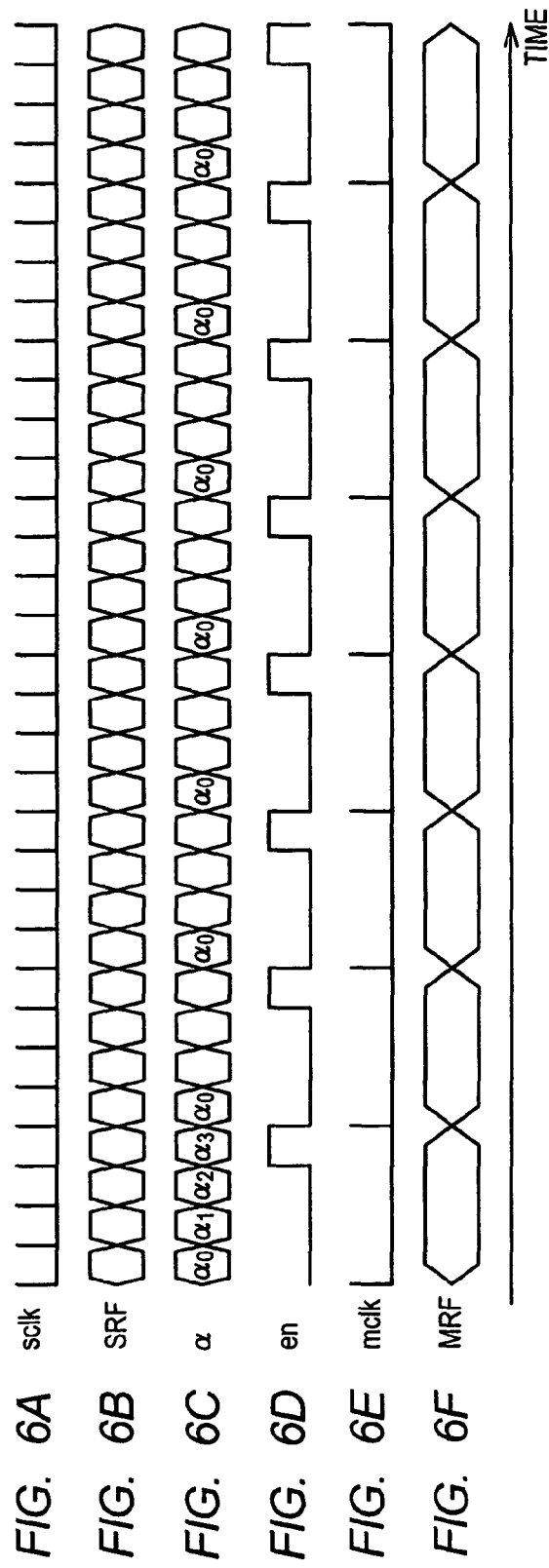
FIGS. 6A to 6F are timing charts illustrating a change in respective signals with time in the digital PLL circuit according to the first embodiment of the present invention.

Subsequently, the operation of the down converter 3 in an example of the decimation ratio M=4 will be described with reference to a timing chart of FIGS. 6A to 6F. FIGS. 6A to 6F are timing charts illustrating a change in respective signals with time in the down converter 3 according to the first embodiment of the present invention. FIGS. 6A to 6F illustrate six timing charts in total. FIG. 6A is a timing chart illustrating a change of the sampling clock signal sclk with time. FIG. 6B is a timing chart illustrating a change of the SRF signal with time. FIG. 6C is a timing chart illustrating a change of the tap coefficient α with time. FIG. 6D is a timing chart illustrating a change of the en signal with time. FIG. 6E is a timing chart illustrating a change of mclk with time. FIG. 6F is a timing chart illustrating a change of the MRF signal with time.

The SRF signals are a data string obtained by sampling the RF signals in timing of the sampling clock sclk, and continue in the order of d0, d1, d2, d3, d4, . . . . The tap coefficients α are repeated in the order of α0, α1, α2, α3, α0, . . . . In this example, because of the decimation ratio M=4, four cycles of the sampling clock signal correspond to one cycle of the tap coefficient α. The values of the MRF continue in the order of e0, e1, and e2, and one MRF is output every time the sampling clock signals for four cycles are output. In this situation, $e0=d0 \times \alpha0+d1 \times \alpha1+d2 \times \alpha2+d3 \times \alpha3$, and $e1=d4 \times \alpha0+d5 \times \alpha1+d6 \times \alpha2+d7 \times \alpha3$ are satisfied. The en signal becomes high every four cycles of the sampling clock signals, and in this timing, a gating cell of the clock divider 33 is controlled according to the en signal to output mclk.

Figure 7:
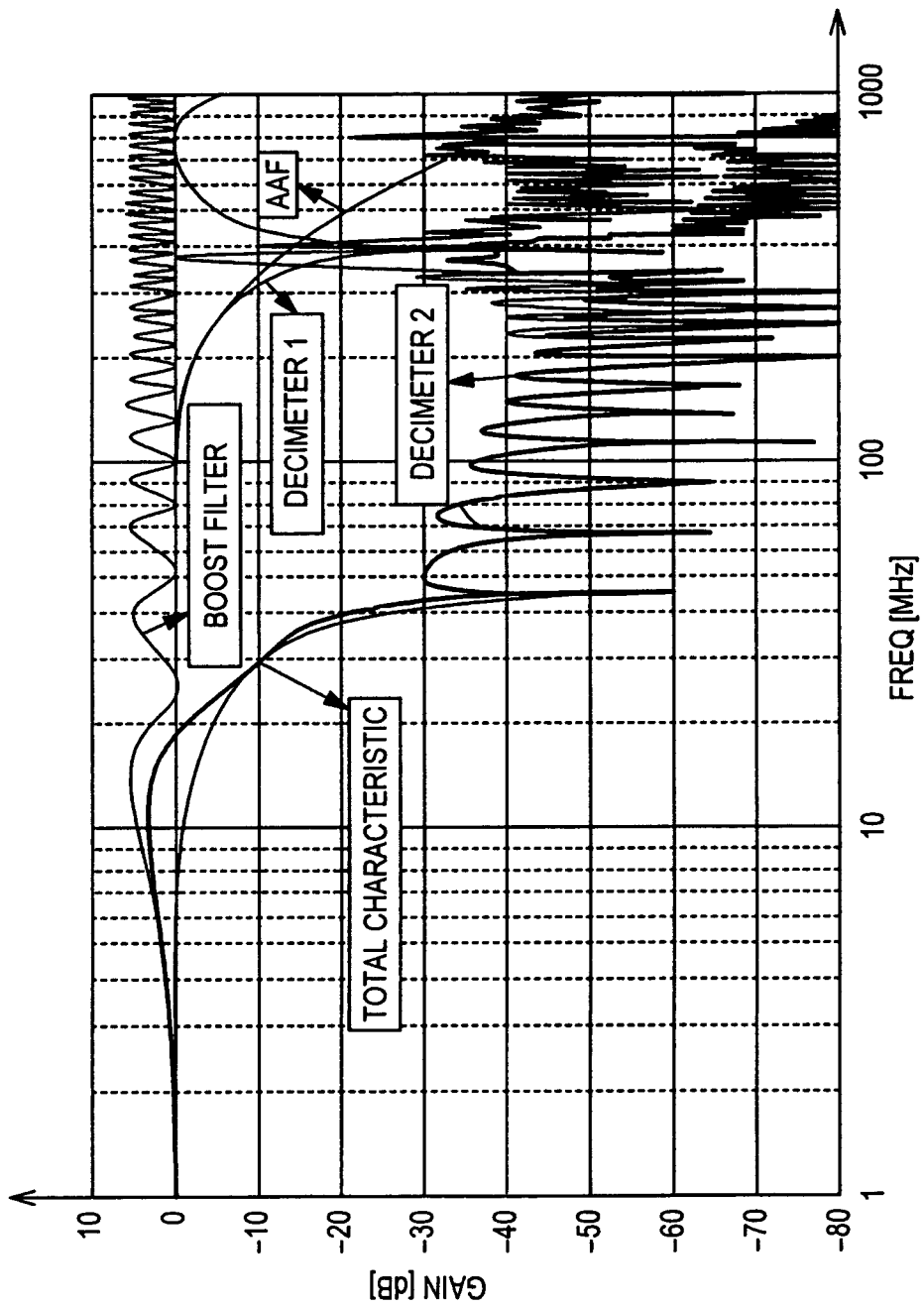
FIG. 7 is a graph illustrating frequency characteristics of an AAF, an ADC, a down converter, and an equalizer in the digital PLL circuit according to the first embodiment of the present invention.

Subsequently, the frequency characteristics of the various filters will be described with reference to a characteristic diagram of FIG. 7. FIG. 7 is a graph illustrating frequency characteristics of the AAF1, the ADC2, the down converter 3, and the digital equalizer 4 in the digital PLL circuit according to the first embodiment of the present invention. The graph of FIG. 7 illustrates a curve indicative of an example of the frequency characteristic of the AAF1 alone, and curves indicative of examples of the respective frequency characteristics of the decimation filter 31 and the digital equalizer 4, and the total frequency characteristics since the RF signal is input until the ERF signal is output.

The graph of FIG. 7 is prepared assuming that the input signal is the double speed readout signal of the DVD, and under the following conditions. The AAF1 is fourth order, the cutoff frequency fc=200 MHz, the frequency fs of the sampling clock signal sclk is 780 MHz, the decimator is configured by two stages in which a first stage is M=2, and a subsequent stage is M=7, the decimator filter corresponds to a 14th-order FIR filter, the digital equalizer 4 is a fifth-order FIR filter, and the tap coefficient is set so that 3 dB is boosted at a 3T-3T frequency. In fact, it is needless to say that the cutoff characteristic and boost characteristic can be freely set by the digital filter.

Subsequently, the operation of the digital phase tracking unit 5 will be described with reference to a timing chart of FIGS. 8A to 8G. FIGS. 8A to 8G are timing charts illustrating the operation of the digital phase tracking unit 5 in the digital PLL circuit according to the first embodiment of the present invention. FIGS. 8A to 8G illustrate seven timing charts in total. FIG. 8A is a timing chart illustrating a change of a channel clock signal CLK with time. FIG. 8B is a timing chart illustrating a change of mclk with time. FIG. 8C is a timing chart illustrating a change of the DRF signal input by the interpolator 51 with time. FIG. 8D is a timing chart illustrating a change of the interpolator phase Φ with time. FIG. 8E is a timing chart illustrating a change of an enable signal en with time. FIG. 8F is a timing chart illustrating a change of the synchronous clock signal gclk with time. FIG. 8G is a timing chart illustrating a change of the GRF signal output by the interpolator 51 with time. In FIG. 8C, black circles represent sampling points, and also in FIGS. 8D and 8G, black circles represent timing corresponding to the sampling points in FIG. 8C.

In the timing charts of FIGS. 8A to 8G, it is assumed that as the input signal, a signal in which marks of a 2T length and spaces of the 2T length are alternately continued (that is, "11001100...") is used. In this example, T is a channel clock cycle, and the input signal is input at the data rate of the frequency slightly higher than the channel clock signal CLK. It is needless to say that the input signal at this time is not synchronous with the channel clock signal CLK. As illustrated in FIG. 8D, the interpolation phase Φ is saw-tooth, and the enable signal en becomes low in discontinuous timing once. There is a need to determine the interpolation function within the interpolator 51 taking the circuit scale and the interpolation precision into account, and the interpolation function is normally a linear function without any problem. The interpolation phase Φ of the interpolator 51 is controlled according to the phase error in a state where the phase that is apparent to be locked with the result that a data string that is locked by the analog PLL and subjected to A/D conversion is output from the interpolator 51. When the interpolation phase Φ exceeds a control range, the operation for one cycle is rest, and therefore discontinuous parts occur. The synchronous clock signal gclk is stopped for a time corresponding to the discontinuous parts to match the rate. The oscillating frequency of the synchronous clock signal gclk is locally identical with mclk, but matches the channel rate in average.

Subsequently, the overall operation of the CAV reproduction will be described with reference to a timing chart of FIGS. 9A to 9D. FIGS. 9A to 9D are timing charts illustrating a change in various numerical values with time in the digital PLL circuit according to the first embodiment of the present invention. FIGS. 9A to 9D illustrate four timing charts in total. FIG. 9A is a timing chart illustrating a change of the channel rate, that is, the number of speed multiples of the input signal with time. FIG. 9B is a timing chart illustrating a change of the decimation ratio M with time. FIG. 9C is a timing chart illustrating a change of the frequency fs/M with time. FIG. 9D is a timing chart illustrating a change of the frequency fnco with time.

The timing charts of FIGS. 9A to 9D illustrate a change of various numerical values with time when the DVD is continuously reproduced from the innermost periphery to the outermost periphery in the CAV system of 4.8 times speed at a maximum. A recording area of the DVD is divided into four zones in a radial direction, and set as a zone 1, a zone 2, a zone 3, and a zone 4 in the order from the inner periphery. The frequency fs of the sampling clock signal sclk is fixed to 780 MHz not depending on the disc radius, and the decimation ratios M of the zones 1 to 4 are set to 12, 10, 8, and 6, respectively. The mclk frequencies of the zones 1 to 4 are fixed within the respective zones, and set to 65 MHz, 78 MHz, 97.5 MHz, and 130 MHz, respectively, and correspond to 2.48 times speed, 2.98 times speed, 3.73 times speed, and 4.97 times speed in the conversion to the multiplied speed of the DVD, respectively.

When reproduction starts from the innermost periphery of the DVD, the channel rate gradually increases as illustrated in FIG. 9A, and fnco also increases as illustrated in FIG. 9D. When the zone 1 is switched to the zone 2, M becomes smaller as illustrated in FIG. 9B, and the mclk frequency increases by 1.2 times. Since the gclk frequency becomes also 1.2 times without any change, in order to prevent this, the frequency within the digital phase tracking unit 5 drops to 1/1.2. For that reason, although a value of fnco is reduced once, the value is again gradually increased together with the radius of a DVD read position. Because an increase in mclk and a decrease in fnco at an inverse ratio thereof are repeated every time the zone is switched, the waveform of fnco becomes saw-tooth.

When the entire surface of the disc is continuously reproduced without changing the decimation ratio M, there is a need that the decimation ratio M of the entire surface of the DVD meets the same condition as that of the outermost periphery, that is, the condition of the zone 4 in the case of FIG. 9B. In this case, there is a need to operate the circuit in a state where the mclk frequency is held to 130 MHz even in the innermost periphery of the DVD. This leads to a fact that the electric power is uselessly consumed.

Subsequently, the operation of switching the decimation ratio M will be described with reference to a timing chart of FIGS. 10A to 10F. FIGS. 10A to 10F are timing charts illustrating a change of various signals with time in the digital PLL circuit according to the first embodiment of the present invention. FIGS. 10A to 10F illustrate six timing charts in total. FIG. 10A is a timing chart illustrating a change of the sampling clock signal sclk with time. FIG. 10B is a timing chart illustrating a change of the clock signal mclk with time. FIG. 10C is a timing chart illustrating a change of the decimation M with time. FIG. 10D is a timing chart illustrating a change of the preset signal preset with time. FIG. 10E is a timing chart illustrating a change of the frequency fnco with time. FIG. 10F is a timing chart illustrating a change of the synchronous clock signal gclk with time.

The timing charts of FIGS. 10A to 10E illustrate the operation of switching the decimation ratio M from 3 to 2. A value of the frequency fnco immediately before the switching operation is 8121, and after the decimation ratio M has been switched to 2, the oscillating frequency preset signal preset delayed as much as the internal delay occurs. In this situation, since the frequency of the clock signal mclk increases by 1.5 times, the frequency fnco is set to 5414 which is 1/1.5 of 8121. As a result, the frequencies of the synchronous clock signal gclk before and after the switching operation become the same frequency in average.

Example

Subsequently, a description will be given of the configuration and operation of the digital PLL circuit according to the first embodiment of the present invention with reference to a specific example.

The operation of the digital PLL circuit according to the first embodiment of the present invention will be described with reference to a configuration diagram of FIG. 3. First, the AAF 1 receives the RF signal, and outputs a signal that has been subjected to bandwidth limit. Then, the ADC 2 digitalizes and outputs an output signal of the AAF 1. In this example, the cutoff frequency used for bandwidth limit is set according to the frequency of the highest multiplied speed to be supported. For example, in the 24 times speed reproduction of the DVD, the channel frequency is 628 MHz, and may be allowed to pass from the lower frequency to ⅙ of the channel frequency without any group delay. Accordingly, in this example, taking the reproduction margin into account, the cutoff frequency of the AAF 1 may be 100 MHz to 200 MHz. Also, in the passband, it is desirable that the phase rotation is reduced as much as possible, and the order is fourth or more order. Because of the digital phase tracking unit 5 at the downstream stage, it is assumed that the ADC 2 conducts the oversampling. The cutoff frequency fc of the AAF 1 and the sampling frequency of the ADC 2 do not always need to be single. However, taking the power consumption of the entire system and the circuit scale into account, options of about two kinds may be provided.

For example, in the PLL of the channel clock synchronization (that is, 1T synchronization), taking the rotation fluctuation of a spindle into account, 634 MHz that is 101% of the sampling frequency is used. In the case of synchronization with the half frequency of the channel clock frequency (that is, 2T synchronization), the sampling clock frequency may be 317 MHz. The quantization bit rate of the ADC 2 is 6 bits or more, and desirably about 8 bits.

Since the decimation filter 31 needs to operate at a high speed, it is desirable that the filter is not of a normal FIR filter type but a successive product-sum type illustrated in FIG. 4. In order to decrease the cutoff frequency of the decimation filter 31, there is a need to increase the order of the filter. For example, in order to realize a filter of $20^{th}$ order, there may be used a multi-stage coupling configuration in which $10^{th}$ order filter is coupled to the downstream stage of the secondary filter. As a result, the capacity of the memory 315 for storing the tap coefficient $\alpha$ can be saved. When the DVD is reproduced at a normal speed, the decimation ratio M is set to 24 while the sampling frequency is the same as that at the time of reproduction at 24 times speed. In this case, the data rate of the MRF signal that is an output after decimation is 634 MHz/24=26.4 MHz in the 1T synchronous control.

The digital equalizer 4 receives the MRF signal, conducts equalization to raise a high-pass gain, and output the signal. More specifically, an FIR filter of a symmetric tap of about fifth order is used. It is needless to say that when the SNR of the input waveform is sufficiently high, the digital equalizer 4 may be bypassed.

The interpolator 51 within the digital phase tracking unit 5 receives an output signal of the digital equalizer 4. The interpolator 51 linearly interpolates ERF data for continuous 2 sampling periods, and generates data GRF corresponding to the interpolation phase $\Phi$. Although the interpolation function may be high-order, if the interpolation function is configured by a higher-order function beyond necessity, the PLL loop delay is increased by an influence of the delay within the interpolator 51, an appropriate order is third or lower order. The phase comparator 52 receives the output signal of the interpolator 51, and outputs a phase error.

Figures 11A, 11B:
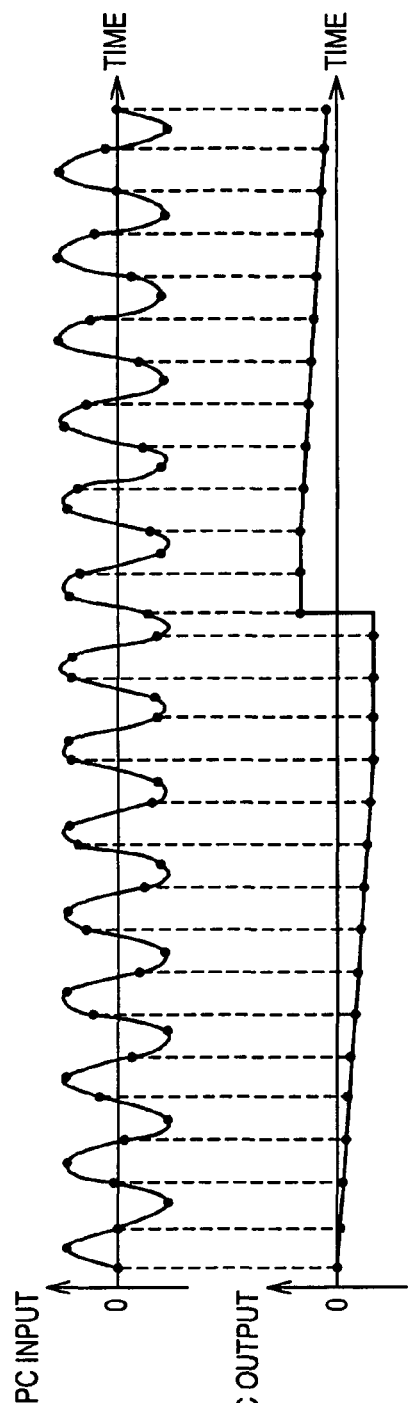
FIGS. 11A and 11B are timing charts illustrating an operation example of a phase comparator in the digital PLL circuit according to the first embodiment of the present invention.

FIGS. 11A and 11B are timing charts illustrating an operation example of the phase comparator 52 in the digital PLL circuit according to the first embodiment of the present invention. The timing charts of FIGS. 11A and 11B are waveform diagrams illustrating the output waveforms when the phase comparator 52 receives a signal in which the marks and spaces each having a 2T length are alternately continuous (11001100 . . . ). FIG. 11A is a waveform diagram illustrating a waveform of the input signal. FIG. 11B is a waveform illustrating a waveform of the output signal.

Black circles in the input signal of FIG. 11A represent sampling points of A/D conversion. The phase comparator 52 code-corrects the amplitude value of the edge neighborhood from the sampled input signal string, and outputs the corrected value. As illustrated in FIG. 11B, the phase difference is returned to $+\pi$ when coming to $-\pi$. Accordingly, a detection range falls within $\pm\pi$. A phase difference detection range of the phase comparator 52 thus configured becomes $\pm\pi$, but may be configured by a phase frequency comparator configuration with a wide range.

Upon receiving the phase error, the loop filter 53 corrects the frequency value. As the configuration of the loop filter 53, it is general to use an integral term and a proportional or the integral term and a primary LPF term as a configuration of the loop filter 53. In order to transmit the frequency information fnco, taking a capture range and tracking precision into account, it is desirable to prepare the bus width of from 10 bits to 20 bits. The integral term within the loop filter 53 is a primary infinite impulse response (IIR) filter circuit with a coefficient 1 which is configured by an adder and a flip flop (FF). In this example, it is assumed that the FF can preset an arbitrary value according to a timing signal generated by the timing generator 6. The NCO 54 receives the frequency value fnco, and generates the interpolation phase $\Phi$ of the interpolator 51 and the synchronous clock signal gclk. The interpolation phase $\Phi$ can be generated by integrating the frequency value fnco through modulo operation. Also, the synchronous clock signal gclk can be generated even when an enable signal is generated every timing when overflow occurs during integration, and the clock signal mclk is gated by the enable signal.

Second Embodiment

Figure 12:
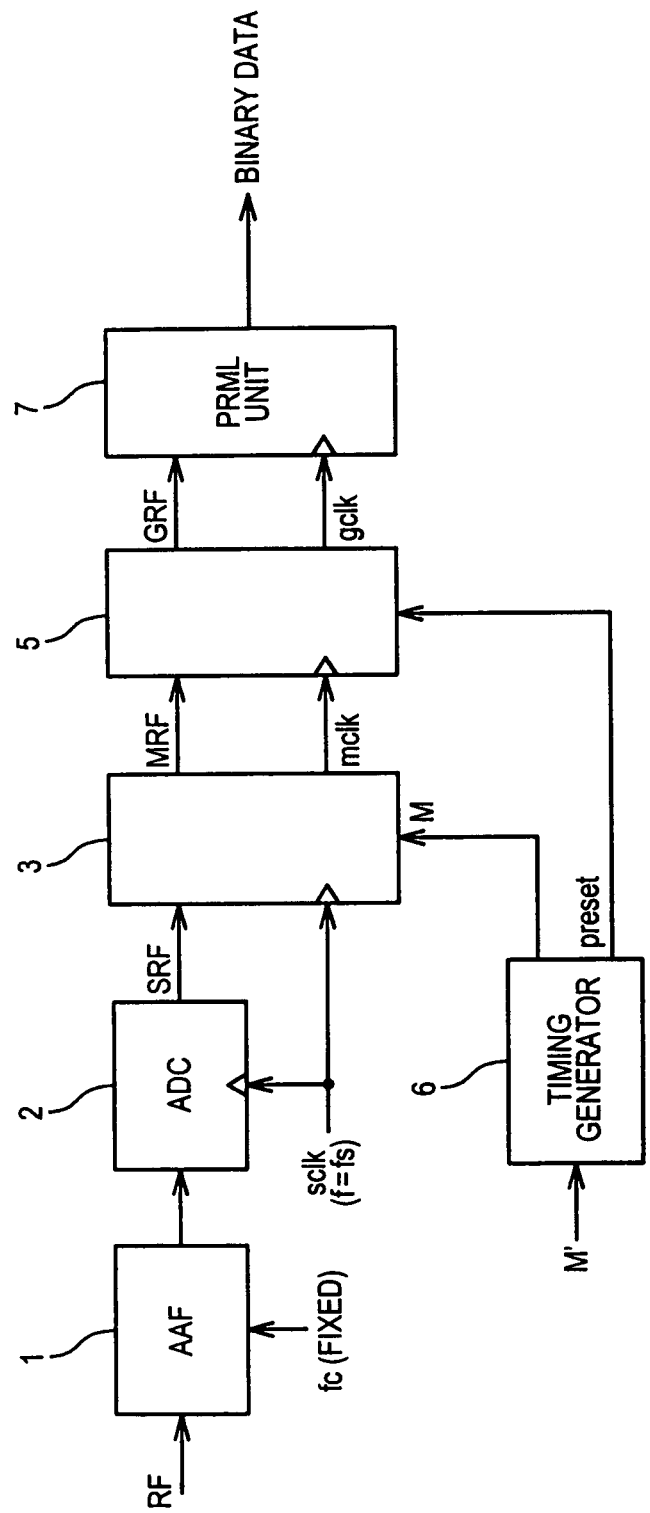
FIG. 12 is a block diagram schematically illustrating an overall configuration of an information detector according to a second embodiment of the present invention.

Subsequently, a second embodiment of the present invention will be described in detail with reference to the accompanying drawings. FIG. 12 is a block diagram schematically illustrating an overall configuration of an information detector according to a second embodiment of the present invention. The information detector in FIG. 12 is obtained by adding a PRML unit 7 to a downstream stage of the digital PLL circuit in FIG. 5 according to the first embodiment of the present invention, and therefore other detailed description will be omitted. The PRML unit 7 of FIG. 12 generates and outputs binary data on the basis of a GRF signal and a synchronous clock signal gclk which are output by the digital phase tracking unit 5.

The first embodiment of the present invention is the digital PLL circuit that extracts a synchronous clock, but the second embodiment is an information detector that detects binary information from the input signal transmitted by a baseband. As the configuration, the PRML unit 7 that has received the GRF signal output by the digital phase tracking unit 5 of the first embodiment is added. It is needless to say that the PRML unit 7 operates in synchronism with the clock output by the digital phase tracking unit 5. The PRML unit 7 may be configured by using a level detector, or may be configured by using a PRML detector.

Although an equalizer is not illustrated in FIG. 12, the digital equalizer 4 may be inserted between the down converter 3 and the digital phase tracking unit 5 as in FIG. 3. That is, the information detector of FIG. 12 is obtained by adding the PRML unit 7 at a downstream stage of the digital PLL circuit in FIG. 5 according to the first embodiment. Similarly, the information detector according to the present invention can be configured by adding the PRML unit 7 at the downstream stage of the digital PLL circuit in FIG. 3.

Third Embodiment

Figure 13:
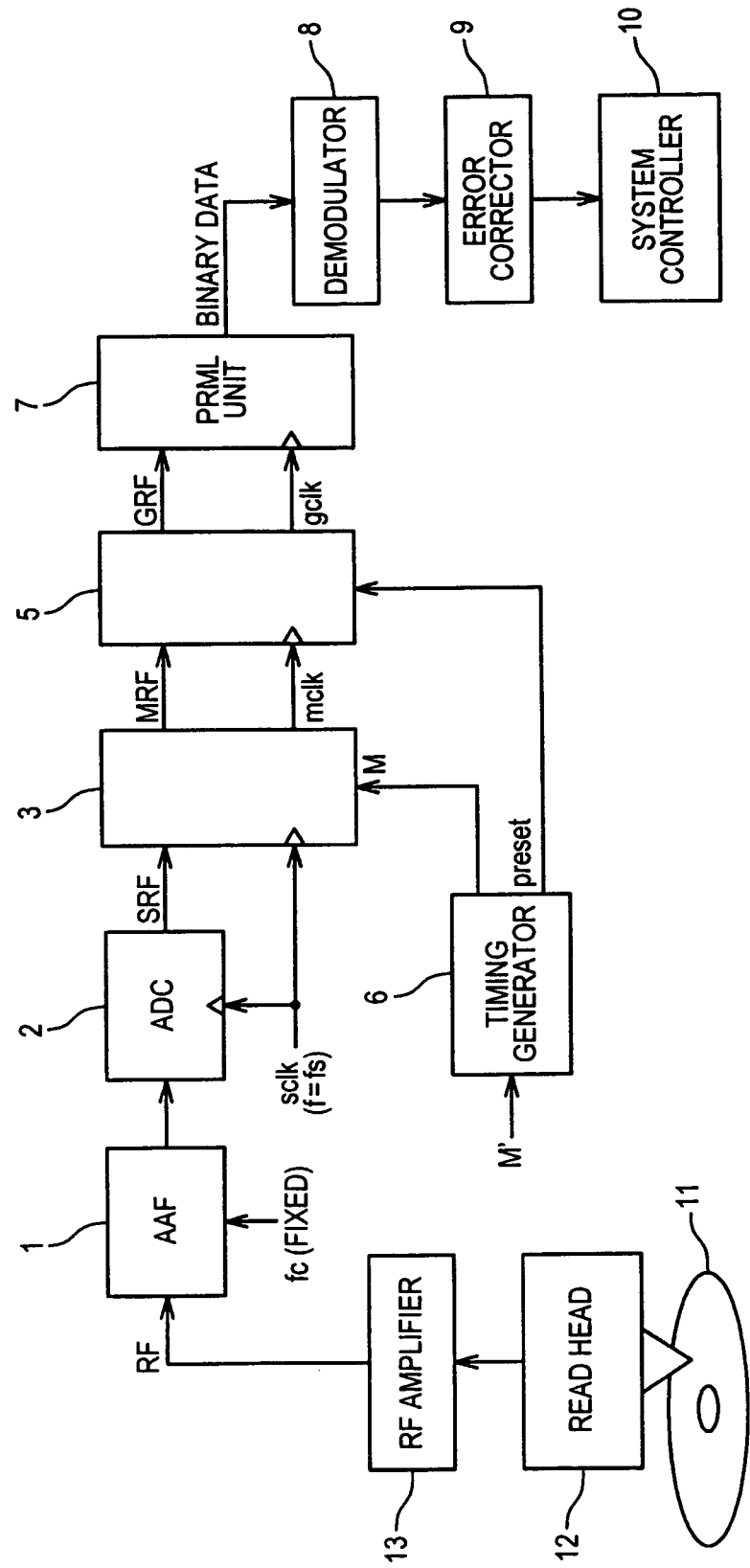
FIG. 13 is a block diagram schematically illustrating an overall configuration of a disc readout device according to a third embodiment of the present invention.

Subsequently, a third embodiment of the present invention will be described in detail with reference to the accompanying drawings. FIG. 13 is a block diagram schematically illustrating an overall configuration of a disc readout device according to a third embodiment of the present invention. The disc readout device in FIG. 13 is obtained by adding a read head 12 and an RF amplifier 13 to an upstream stage, and a demodulator 8, an error corrector 9, and a system controller 10 to a downstream stage in the information detector according to the second embodiment of the present invention. In this example, the RF amplifier 13 is coupled to the downstream stage of the read head 12, the AAF 1 in the information detector is coupled to the downstream stage of the RF amplifier 13, and the demodulator 8, the error corrector 9, and the system controller 10 are coupled in series to the downstream stage of the PRML unit 7 in the information detector in the stated order.

The disc readout device and other configurations of FIG. 13 are identical with those in FIG. 12, and therefore a more detailed description will be omitted.

The disc readout device according to a third embodiment of the present invention is that the information detector according to the second embodiment is applied to the information detection of the disc readout device. A spindle motor not shown rotates a disc information recording medium 11, and the read head 12 reads information recorded in the information recording medium 11, and converts the read information into an electric signal. The present invention is applicable even if the disc information recording medium 11 is any one of a magnetic disc, a magneto optical disc, and a phase-change disc. A read position of the read head 12 is accurately controlled by a device such as an actuator not shown. Because the output signal of the read head 12 is generally weak, the output signal is amplified by the RF amplifier 13. In the example of FIG. 13, the RF amplifier 13 is configured as a component separate from the read head 12. However, if the output of the read head 12 is sufficiently large, the RF amplifier 13 can be omitted. Also, the read head 12 may have a function of the RF amplifier 13.

The RF signal output by the RF amplifier 13 is supplied to the AAF 1 in the information detector, and after the information detector that has received the RF signal has conducted a sequence of processing, the information detector a string of binary data corresponding to the RF signal. The demodulator 8 demodulates and outputs the binary data string. The error corrector 9 subjects the output signal of the demodulator 8 on a symbol basis, and outputs the corrected signal. The corrected data output by the error corrector 9 is output to a higher system through the system controller 10.

As has been described above, the digital PLL circuit according to the present invention is suitable as a PLL having a wide capture range for reproducing the information recorded on, particularly, on the disc recording medium.

What is claimed is:

1. A digital PLL (phase locked loop) circuit, comprising:
an AAF (anti aliasing filter) that limits a frequency bandwidth of an input RF (radio frequency) signal on a basis of a given cutoff frequency;
an ADC (analog to digital converter) that samples an output signal of the AAF on a basis of a given sampling frequency;
a down converter that converts a data rate of the ADC; and
a digital phase tracking unit that generates a synchronous clock signal from an output signal of the down converter on a basis of a given internal frequency,
wherein the cutoff frequency and the sampling frequency are fixed, respectively, even when a frequency bandwidth of the RF signal fluctuates, and
wherein the down converter reduces a data rate according to an increase in a frequency bandwidth of the RF signal.

2. The digital PLL circuit according to claim 1, further comprising: a timing generator that generates a timing signal that controls timing for switching the data rate and timing for switching the internal frequency of the digital phase tracking unit,
wherein the internal frequency is switched to an inverse multiple of a given coefficient.

3. The digital PLL circuit according to claim 1, wherein the down converter includes a low-pass filter that can change a cutoff frequency, and a decimator that decimates an output signal of the low-pass filter.

4. The digital PLL circuit according to claim 3, wherein the down converter further includes an interpolator that is coupled to an upstream stage of the low-pass filter, and multiplies a data rate of the output signal of the ADC through a decimation processing.

5. The digital PLL circuit according to claim 3, further comprising a digital waveform equalizer that equalizes a waveform of the output signal of the down converter, and supplies the equalized waveform to the digital phase tracking unit.

6. An information detector, comprising:
the PLL circuit according to claim 2; and
a detector that generates binary data from synchronous sample RF information further generated by the digital phase tracking unit.

7. A disc readout device, comprising:
an information detector according to claim 6; and
a read head that is coupled to an upstream stage of the information detector, and supplies a readout signal obtained by reading information recorded on a recording medium on a disc to the AAD as the RF signal.

8. A signal processing method, comprising:
limiting a frequency bandwidth of an input RF signal on a basis of a given cutoff frequency;
sampling a signal limiting the frequency bandwidth on a basis of a given sampling frequency;
converting a data rate of the sampled signal;
reducing the data rate according to an increase in a frequency bandwidth of the RF signal; and
generating a synchronous clock signal from the signal having a converted data rate on the basis of a given internal frequency,
wherein the cutoff frequency and the sampling frequency are fixed, respectively, even if the frequency bandwidth of the RF signal fluctuates.

9. A signal processing method for a PLL circuit, the signal processing method comprising the method of claim 8.

10. The signal processing method according to claim 9, wherein a decimation ratio is controlled by the PLL circuit.

* * * * *